United States Patent [19]

Harada et al.

[11] Patent Number: 5,135,906
[45] Date of Patent: Aug. 4, 1992

[54] SUPERCONDUCTING THIN FILM OF COMPOUND OXIDE AND PROCESS FOR PREPARING THE SAME

[75] Inventors: Keizo Harada; Hideo Itozaki, both of Itami, Japan

[73] Assignee: Sumitomo Electric Industries, Ltd., Osaka, Japan

[21] Appl. No.: 557,286

[22] Filed: Jul. 24, 1990

[30] Foreign Application Priority Data

Jul. 24, 1989 [JP] Japan ................................. 1-191013

[51] Int. Cl.$^5$ ............................................. B32B 9/00
[52] U.S. Cl. ........................................ 505/1; 505/701; 505/702; 505/703; 505/704; 428/426; 428/432; 428/433; 428/688; 428/930
[58] Field of Search ............................ 505/1, 701-704; 428/426, 432, 433, 688, 930

[56] References Cited

U.S. PATENT DOCUMENTS 4,942,142  7/1990  Itozaki et al. ...................... 428/688

FOREIGN PATENT DOCUMENTS 9003265  4/1990  European Pat. Off. .

OTHER PUBLICATIONS

Surface & Interface Properties of High Tc Superconductors, Meyer III et al., Chap. 21, pp. 280-289, 1988, ACS.

Primary Examiner—Patrick J. Ryan
Assistant Examiner—Ta Powers
Attorney, Agent, or Firm—Pennie & Edmonds

[57] ABSTRACT

A superconducting thin film of Bi-containing compound oxide deposited on a substrate, a buffer layer made of $Bi_2O_3$ being interposed between the superconducting thin film and the substrate.

4 Claims, 1 Drawing Sheet

1 : CHAMBER
2 : K-CELL
3 : SUBSTRATE HOLDER
4 : HEATER
5 : SUBSTRATE
6 : OXYGEN SUPPLY PIPE
8 : SHUTTER
10 : VAPOUR SOURCE

1 : CHAMBER
2 : K-CELL
3 : SUBSTRATE HOLDER
4 : HEATER
5 : SUBSTRATE
6 : OXYGEN SUPPLY PIPE
8 : SHUTTER
10 : VAPOUR SOURCE

SUPERCONDUCTING THIN FILM OF COMPOUND OXIDE AND PROCESS FOR PREPARING THE SAME

BACKGROUND OF THE INVENTION

1. Field of the Invention

The present invention relates to a superconducting thin film of compound oxide and a process for preparing the same. More particularly, it relates to an improved superconducting thin film of Bi-containing compound oxide deposited on a substrate and a process for preparing the same.

2. Description of the Related Art

When oxide superconductors are utilized in electronics devices or the like, it is indispensable to prepare their thin films. Thin films of the compound oxides deposited on single crystal substrates of oxides such as $SrTiO_3$, MgO or the like exhibits relatively higher superconducting property because of the following reasons:

Firstly, bad influence of diffusion or migration of elements of which the substrate is made is relatively lower, although such diffusion or migration of substrate elements is inevitable when the compound oxides are deposited on substrates.

Secondly, it is rather easy to prepare well-oriented or well-ordered thin films of polycrystals or single crystals of superconducting compound oxides when these compound oxides are deposited on predetermined planes of such single crystal substrates of $SrTiO_3$, MgO or the like. In fact, so-called epitaxial growth is rather easily realized when the thin films of compound oxides are deposited on such single crystal substrates of $SrTiO_3$, MgO or the like, so that the superconducting thin films deposited on these substrates become single crystals or polycrystals which have very well ordered crystalline structure and show improved superconducting property. Still more, anisotropy of the superconducting property which is inherent in these compound oxide superconductors can be controlled.

Film formation of these oxide superconductors is effected usually by physical vapour deposition technique such as sputtering, ion-plating and chemical vapour deposition technique such as MO—CVD.

However, oxide superconductor thin films prepared by known processes are difficultly applicable to electronics devices because their surfaces are not smooth. Such surface unevenness of superconductor thin film may be caused by influence of surface roughness of the substrates and by mismatch of lattice constants between substrate crystal and superconductor crystal.

Namely, the surface of the single crystal substrate of oxide is not smooth in the atomic level. In fact, even if the surface of the single crystal substrate of oxide is polished completely, its diffraction pattern observed by a reflective high-energy electron diffraction analyzer (RHEED) is a spotty pattern but is not a streaky pattern which reflect surface smoothness. The mismatch of lattice constants between substrate crystal and superconductor crystal is another cause of surface unevenness because a stress in the thin film which can be absorbed at an early stage of film formation is released when the thin film becomes thicker.

U.S. Pat. No. 4,837,609 proposes to insert a layer of W, Mo or Ta between a superconducting compound oxide layer and a silicon single crystal substrate.

Japanese patent laid-open No. 63-239,840 proposes to oxidize a copper substrate to form a CuO layer thereon and then a superconducting compound oxide layer is deposited on the CuO layer.

These prior arts, however, neither describes not mentions surface smoothness of the superconducting thin films.

Therefore, an object of the present invention is to solve the problems of known processes and to provide an improved oxide superconductor thin film having a smooth surface.

SUMMARY OF THE INVENTION

The present invention provides a superconducting thin film of Bi-containing compound oxide deposited on a substrate, characterized in that a buffer layer made of $Bi_2O_3$ is interposed between the superconducting thin film and the substrate.

The Bi-containing compound oxide can be any known compound oxide containing bismuth. Followings are examples thereof:

$$Bi_2Sr_2Ca_{n-1}Cu_nO_x \tag{1}$$

in which "n" and "x" are numbers each satisfying a range of $1 \leq n \leq 6$ and $6 \leq x \leq 16$ $$Bi_4(Sr_{1-x}, Ca_x)_m Cu_n O_{p+y} \tag{2}$$

in which "x", "m", "n", "p" and "y" are numbers each satisfying a range of $6 \leq m \leq 10$, $4 \leq n \leq 8$ $0 < x < 1$ and $-2 \leq y \leq +2$, respectively and $p=(6+m+n)$.

In this system, following compositions are preferable:
(i) $7 \leq m \leq 9$, $5 \leq n \leq 7$ $0.4 < x < 0.6$
(ii) $6 \leq m \leq 7$, $4 \leq n \leq 5$ $0.2 < x < 0.4$
(iii) $9 \leq m \leq 10$, $7 \leq n \leq 8$ $0.5 < x < 0.7$ $$Bi_{2-y}Pb_ySr_2Ca_{n-1}Cu_nO_x \tag{3}$$

in which "y", "n" and "x" are numbers each satisfying a range of $0.1 \leq y \leq 1$, $1 \leq n \leq 6$ and $6 \leq x \leq 16$ respectively.

These Bi-containing compound oxides are preferably of a single crystal. Thickness of these Bi-containing compound oxides is not limited to a special value but is preferably in the order of 100 Å to 1 μm.

The substrate is preferably a single crystal substrate of oxide such as MgO, $SrTiO_3$ and YSZ in order to facilitate epitaxial growth of the buffer layer of $Bi_2O_3$ and/or of the superconducting thin film. The other substrates which can be used in the present invention include single crystals of $LaGaO_3$, $NdGaO_3$ and $LaAlO_3$.

The film forming plane depends to the substrate used. In the case of single crystal substrates of MgO and $SrTiO_3$, their {100} plane and {110} plane are preferably used.

An essence of the present invention resides in that a buffer layer made of $Bi_2O_3$ is interposed between the superconducting thin film and the substrate.

The buffer layer made of $Bi_2O_3$ is preferably of single crystal. Thickness of this buffer layer of $Bi_2O_3$ is preferably between 10 Å to 1000 Å, more preferably between 10 Å to 100 Å. If the thickness of this buffer layer is not thicker than 10 Å, satisfactory advantage of the present invention can not be obtained. To the contrary, if the thickness of this buffer layer exceeds 1,000 Å, crystallinity of $Bi_2O_3$ in the thin film become disordered and result in that a bad influence is given to the superconducting thin film. The best crystallinity of $Bi_2O_3$ buffer layer is realized in a range of thickness between 10 Å to 1,000 Å and a better advantage of the present invention is obtained in this range.

The $Bi_2O_3$ buffer layer according to the present invention functions to absorb unevenness of surface roughness of the substrate and to absorb the difference in lattice constant of crystals between the compound oxide superconductor and the substrate. And hence, the superconducting thin films of compound oxides according to the present invention have smooth surfaces which are advantageously applicable to electronics devices.

In fact, following points are mentioned as advantages of the present inventions:

(1) In the superconductors of Bi-containing compound oxides characterized by their stratified crystal structures, it is known that diffusion or migration of elements between adjacent layers of Ba-O is very small or reduced. This means that the thin film of $Bi_2O_3$ buffer layer which exists beneath a surface of the Bi-containing compound oxide layer will not change stoichiometry in the superconducting thin film because of the reduced diffusion or migration.

(2) It is relatively easy to realize epitaxial growth of the $Bi_2O_3$ thin film on the single crystal substrate. In fact, the surface of the thin films of $Bi_2O_3$ deposited on the single crystal substrates are so smooth that their diffraction pattern observed by a reflective high-energy electron diffraction analyzer (RHEED) show streaky patterns.

(3) The lattice constant of $Bi_2O_3$ crystal is very similar to that of Bi-containing oxide superconductor such as $Bi_2Sr_2Ca_{n-1}Cu_nO_x$ or the like and hence epitaxial growth of the Bi-containing oxide superconductor on the $Bi_2O_3$ thin film is facilitated.

Both of the $Bi_2O_3$ buffer layer and the superconducting Bi-containing compound oxide layer can be prepared by any one of known conventional thin film forming techniques including physical vapour deposition such as molecular beam epitaxial growth (MBE), sputtering, ion-beam sputtering, and ion-plating and chemical vapour deposition (CVD).

In practice, a thin film of $Bi_2O_3$ is firstly deposited on a substrate in a vacuum chamber, and then a desired superconducting thin film of Bi-containing compound oxide is deposited on the thin film of $Bi_2O_3$ in the same vacuum chamber.

Since both of the $Bi_2O_3$ and the Bi-containing compound oxide are oxides, it is necessary to supply oxygen in addition to metal elements of which the Bi-containing compound oxide is made during the film forming stage. The oxygen gas is supplied directly in the neighborhood of a surface of the substrate while the metal elements are fed in a form of vapors from evaporation source(s). Of course, an oxide or oxides of constituent elements of the Bi-containing compound oxide can be evaporated directly from evaporation source(s). Or, any combination of these operation modes can be used. The oxygen is preferably activated by micro-wave radiation before use. Ozone may be used in place of oxygen. It is also effective to produce activated oxygen by creating a plasma discharge by means of high-frequency in a vacuum chamber.

Film forming conditions of the Bi-containing compound oxides are known and can be used in the process according to the present invention. Examples of film forming conditions of the $Bi_2O_3$ buffer layer are shown below but the scope of the present invention should not be limited thereto.

Examples of Film Forming Conditions of $Bi_2O_3$ Buffer Layer

| | | |
|---|---|---|
| (1) | In vacuum deposition process. | |
| | Pressure in a chamber: | $5 \times 10^{-4}$ Torr |
| | Substrate temperature: | 550° C. |
| | Deposition rate: | 1 Å/sec |
| | Oxygen supply: | 30 ml/min |
| | RF powder: | 200 W |
| (2) | In sputtering process. | |
| | Target: | $Bi_2O_3$ |
| | Substrate temperature: | 600° C. |
| | Sputtering gas: | $Ar + O_2$ |
| | | ($O_2$ is 20 vol %) |
| | | $5 \times 10^{-2}$ Torr |
| | Sputtering rate: | 0.5 Å/sec |
| | Oxygen supply: | 30 ml/min |

The superconducting thin films according to the present invention possess very smooth surfaces and hence improved superconducting properties, so that they can be utilized advantageously in applications of Matisoo switching elements, Annaker memories, Josephson device, a variety of sensors or Superconducting Quantum Interference Device (SQUID) or the like.

Now, the present invention will be described with reference to Examples, but the scope of the invention should not be limited to the Examples.

EXAMPLE 1

Figure 1:
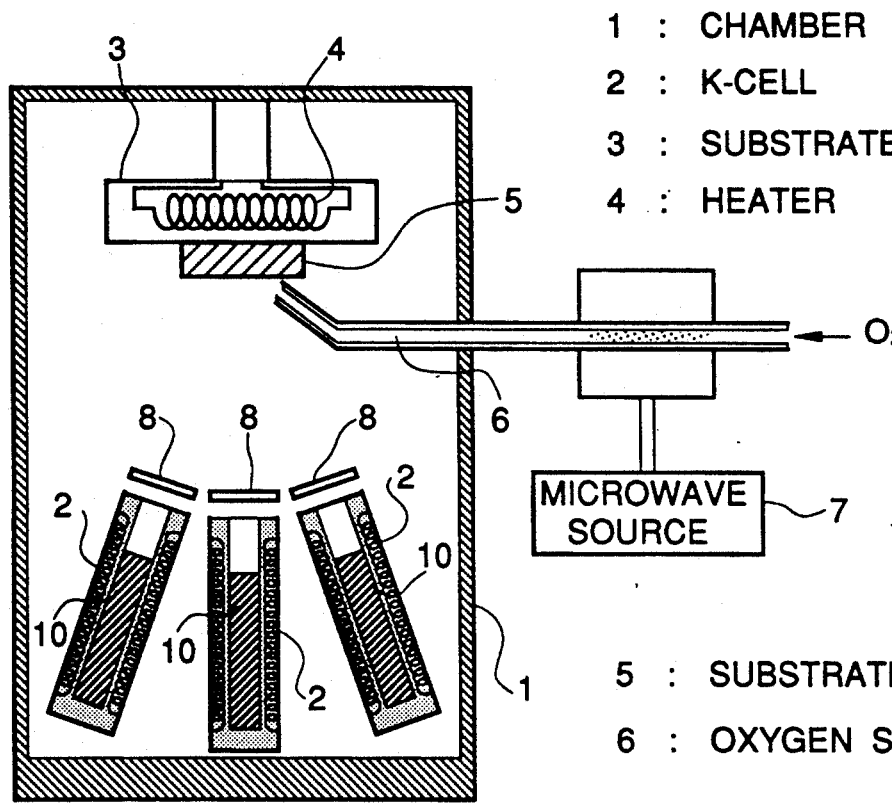
FIG. 1 illustrates an apparatus for depositing thin films of $Bi_2O_3$ and of oxide superconductor on a substrate which can be used in the process according to the present invention.

A superconducting thin film of compound oxide according to the present invention of $Bi_2Sr_2Ca_2Cu_3O_x$ was deposited on a {100} plane of a MgO single crystal substrate by a molecular beam epitaxy (MBE) unit illustrated in FIG. 1.

The MBE unit shown in FIG. 1 comprises a chamber 1 interior of which is evacuated to a high vacuum, a plurality of Kunudsen Cells (K-cells) 2 each of which can control a temperature of a vapour source 10 placed therein, a plurality of shutters 8 for controlling the amount or timing of each vapour source 10, a substrate holder 34 provided with a heater 4 for heating a substrate 5, and an oxygen gas supply pipe 6 through which oxygen excited by microwave discharge supplied from a microwave source 7.

At first, a thin film of $Bi_2O_3$ was deposited on the {100} plane of a MgO single crystal substrate under the following conditions:

| | |
|---|---|
| Vapour source: | elemental Bi |
| Temperature of the vapour source: | 530° C. |
| Substrate temperature: | 600° C. |
| Micro-wave power: | 100 W |
| Deposition rate: | 0.5 Å/sec |
| $O_2$ partial pressure: | $5 \times 10^{-6}$ Torr |
| Thickness of thin film: | 40 Å |

The resulting thin film of $Bi_2O_3$ was observed by a RHEED analyzer to showed a streaky pattern which revealed that the $Bi_2O_3$ thin film is an epitaxially grown film of good quality.

Then, a thin film of $Bi_2Sr_2Ca_2Cu_3O_x$ was deposited on the $Bi_2O_3$ thin film in the same chamber as above under the following conditions:

| Vapour sources and temperatures: | Bi (530° C.) |
| --- | --- |
| | Sr (900° C.) |
| | Ca (950° C.) |
| | Cu (1,400° C.) |
| Substrate temperature: | 700° C. |
| Deposition rate: | 0.5 Å/sec |
| Power of microwave generator: | 100 W |
| Partial oxygen pressure: | $5 \times 10^{-6}$ Torr |
| Thickness: | 500 Å |

Figure 2:
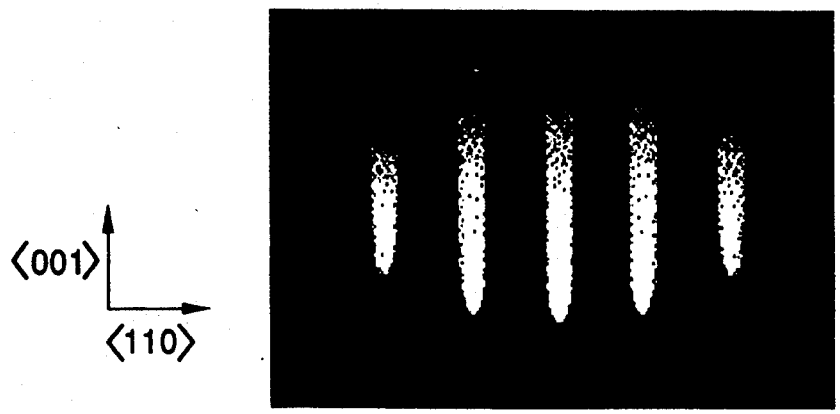
FIG. 2 is a RHEED pattern of a thin film of $Bi_2Sr_2Ca_{n-1}Cu_nO_x$ which was grown to a thickness of 500 Å in an example according to the present invention.

FIG. 2 is a diffraction patter of the resulting superconducting thin film observed by a RHEED analyzer. The diffraction pattern is so streaky that it reveals such a fact that the superconducting thin film is a single crystal having a smooth surface.

As a comparison, another thin film of $Bi_2Sr_2CaCu_3O_x$ was deposited directly on a {100} plane of a MgO substrate under the same condition as above without the $Bi_2O_3$ buffer layer.

The superconducting properties of the resulting superconducting thin films according to the present invention and of the comparative example were determined. The results are summarized in the following table.

| | Invention | comparative |
| --- | --- | --- |
| Critical temperature (K) (a temperature from which resistance could not be measured) | 105 | 93 |
| Critical current density (A/cm²) (at liquid nitrogen temperature) | $4.2 \times 10^6$ | $1.3 \times 10^4$ |

It was confirmed that the superconducting thin film of Bi-containing compound oxide shows higher critical temperature and higher critical current density than those that are obtained by the comparative example.

EXAMPLE 2

Example 1 was repeated by conditions were modified as following:

At first, a thin film of $Bi_2O_3$ was deposited on a {100} plane of a $SrTiO_3$ single crystal substrate under the following conditions:

| Vapour source: | elemental Bi |
| --- | --- |

| Temperature of the vapour source: | 530° C. |
| --- | --- |
| Substrate temperature: | 600° C. |
| Deposition rate: | 0.5 Å/sec |
| Micro-wave power: | 100 W |
| $O_2$ partial pressure: | $5 \times 10^{-6}$ Torr |
| Thickness of thin film: | 100 Å |

The resulting thin film of $Bi_2O_3$ was an epitaxially grown film of the same high quality as Example 1.

Then, a thin film of $Bi_2Sr_2Ca_2Cu_3O_x$ was deposited on the $Bi_2O_3$ thin film in the same chamber as above under the following conditions:

| Vapour sources and temperatures: | Bi (530° C.) |
| --- | --- |
| | Sr (600° C.) |
| | Ca (650° C.) |
| | Cu (1,180° C.) |
| Substrate temperature: | 700° C. |
| Deposition rate: | 0.5 Å/sec |
| Power of microwave generator: | 100 W |
| Partial oxygen pressure: | $8 \times 10^{-6}$ Torr |
| Thickness: | 1,000 Å |

The resulting superconducting thin film was a very smooth film which shows a streaky pattern.

The critical temperature (Tc) and the critical current density (Jc) are as followings:

| Tc: | 108 K |
| --- | --- |
| Jc: | $4.3 \times 10^6$ A/cm² (at 77 K) |

We claim:

1. A superconducting thin film of Bi-containing compound oxide deposited on a substrate, characterized in that a buffer layer made of $Bi_2O_3$ wherein said buffer layer has a thickness between 10 Å and 1,000 Å is interposed between said superconducting thin film of Bi-containing compound oxide and said substrate; wherein said superconducting thin film of Bi-containing compound oxide has a composition represented by the formula:

$$Bi_4(Sr_{1-x}, Ca_x)_m Cu_n O_{p+y}$$

in which "x", "m", "n", "p" and "y" are numbers each satisfying a range of $6 < m \leq 10$, $4 \leq n \leq 8$, $0 \leq x \leq 1$ and $2 \leq y \leq +2$ respectively and $p = (6+m+n)$.

2. The superconducting thin film set forth in claim 1 wherein said buffer layer of $Bi_2O_3$ has a thickness between 10 Å and 100Å.

3. The superconducting thin film set forth in claim 1 wherein said substrate is of a single crystal of an oxide.

4. A superconducting thin film set forth in claim 3 wherein said substrate is a single crystal of an oxide selected from the group comprising MgO, $SrTiO_3$ and YSZ.

* * * * *